(12) United States Patent
Mizuguchi

(10) Patent No.: US 9,831,578 B2
(45) Date of Patent: Nov. 28, 2017

(54) BOARD CONNECTING CONNECTOR

(71) Applicant: HIROSE ELECTRIC CO., LTD., Tokyo (JP)

(72) Inventor: Tomohiro Mizuguchi, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/298,276

(22) Filed: Oct. 20, 2016

(65) Prior Publication Data

US 2017/0117647 A1    Apr. 27, 2017

(30) Foreign Application Priority Data

Oct. 27, 2015    (JP) .................................. 2015-211030

(51) Int. Cl.
| | |
|---|---|
| *H01R 12/71* | (2011.01) |
| *H01R 13/436* | (2006.01) |
| *H01R 12/72* | (2011.01) |
| *H01R 12/87* | (2011.01) |
| *H01R 13/42* | (2006.01) |
| *H05K 5/00* | (2006.01) |
| *H01R 12/70* | (2011.01) |

(52) U.S. Cl.
CPC ......... *H01R 12/712* (2013.01); *H01R 12/721* (2013.01); *H01R 12/87* (2013.01); *H01R 13/42* (2013.01); *H01R 13/4361* (2013.01); *H05K 5/0039* (2013.01); *H01R 12/7011* (2013.01)

(58) Field of Classification Search
CPC .. H01R 27/00; H01R 23/7005; H05K 7/1418; G06K 7/0021

USPC .................................................. 439/630, 377
See application file for complete search history.

(56) References Cited

U.S. PATENT DOCUMENTS

| | | | |
|---|---|---|---|
| 6,178,094 B1 | 1/2001 | Hakozaki | |
| 6,269,006 B1 * | 7/2001 | Treiber | ................ H05K 7/1418 361/741 |
| 9,325,093 B2 | 4/2016 | Endo et al. | |
| 9,413,090 B2 | 8/2016 | Nagamine | |

(Continued)

FOREIGN PATENT DOCUMENTS

| | | |
|---|---|---|
| JP | 2014-003007 A | 1/2014 |
| JP | 5754533 B1 | 6/2015 |
| WO | 2005075253 A1 | 8/2005 |

*Primary Examiner* — Gary Paumen
(74) *Attorney, Agent, or Firm* — Kubotera & Associates, LLC

(57) ABSTRACT

A board connecting connector includes a board retaining portion and a terminal retaining portion. The board retaining portion is configured to retain or accommodate a board, and the terminal retaining portion is configured to retain or accommodate terminals. When the board retaining portion and the terminal retaining portions are in a state of fitting to each other, terminal portions provided on a board surface of the board and contact portions of the terminals contact to each other. The board retaining portion includes a fitting fixing portion and a board supporting portion. The fitting fixing portion is provided on a contacting side where the terminal portions of the board contact with the contact portions of the terminals, so as to press the board to secure therein. The board supporting portion is provided at a place other than the contacting side and can support the board.

13 Claims, 13 Drawing Sheets

(56) References Cited

U.S. PATENT DOCUMENTS

| | | | |
|---|---|---|---|
| 2001/0003074 A1* | 6/2001 | Johnson | H01R 12/7005 439/377 |
| 2013/0122736 A1* | 5/2013 | Wittekind, III | G01N 33/48785 439/377 |
| 2014/0305691 A1 | 10/2014 | Nishio | |

* cited by examiner

BOARD CONNECTING CONNECTOR

BACKGROUND OF THE INVENTION AND RELATED ART STATEMENT

The present invention relates to a board connecting connector to be mounted in an automobile, a motorcycle, and the like. In particular, the present invention relates to a board connecting connector having a board retaining portion to accommodate a board and a terminal retaining portion to accommodate terminals.

Patent References 1 and 2 have disclosed conventional board connecting connectors. In these years, in automobiles industries including cars and motorcycles, there has been rapid advancement in development of the conventional board connecting connectors such as those disclosed in Patent References 1 and 2.

Patent Reference 1: Japanese Patent Publication No. 5754533

Patent Reference 2: Japanese Patent Application Publication No. 2014-3007

According to Patent References 1 and 2, the conventional board connecting connector is composed of a set of a board retaining portion and a terminal retaining portion. The board retaining portion is to accommodate a board, on which various electronic components are mounted. The terminal retaining portion accommodates a plurality of terminals, to which cables are connected. When the board retaining portion is fitted into the terminal retaining portion, a board supported with the board retaining portion is sandwiched in a thickness direction thereof between a contact portion of the terminal provided on one side of the terminal retaining portion and another contact portion of the terminal provided on the other side of the terminal retaining portion facing to the one side. In this state, the contact portions of the terminals elastically contact with terminal portions provided on a board surface of the board.

When the conventional board connecting connector is used, for example, in a car, etc., the conventional board connecting connector tends to be exposed to vibrations and a high temperature. As a result, the contact between the terminal portions on the board surface and the contact portions of the terminals may become unstable. It should be noted that the electronic components mounted on the board are essential components for controlling an engine, a brake, and the like of a vehicle. Accordingly, it is very critical to maintain stability of the contact between the terminal portions and the contact portions.

In the conventional board connecting connector, when the board supported with the board retaining portion becomes unstable, the contact between the terminal portions on the board surface and the contact portions of the terminals tend to becomes unstable. Therefore, when the board becomes unstable, it is difficult to maintain the stability of the contact. For this reason, it is necessary to stabilize the contact between the board and the terminals when the board retaining portion is fitted into the terminal retaining portion.

In view of the problems of the conventional board connecting connector described above, an object of the present invention is to provide a board connecting connector capable of securely contacting a board with a terminal when a board retaining portion thereof is fitted into a terminal retaining portion thereof.

Further objects and advantages of the present invention will be apparent from the following description of the present invention.

SUMMARY OF THE PRESENT INVENTION

In order to attain the objects described above, according to a first aspect of the present invention, a board connecting connector includes a board retaining portion and a terminal retaining portion. The board retaining portion is configured to retain or accommodate a board, and the terminal retaining portion is configured to retain or accommodate terminals. When the board retaining portion and the terminal retaining portions are in a state of fitting to each other, terminal portions provided on a board surface of the board and contact portions of the terminals contact to each other. The board retaining portion includes a fitting fixing portion and a board supporting portion. The fitting fixing portion is provided on a contacting side where the terminal portions of the board contact with the contact portions of the terminals, so as to press the board to secure therein. The board supporting portion is provided at a place other than the contacting side and can support the board.

According to the first aspect of the present invention, in the board connecting connector, on the contacting side where the terminal portions provided on the board surface contact with the contact portions of the terminals, it is achievable to surely position the board in the board retaining portion. As a result, it is achievable to stabilize the contact between the board and the terminals when the board retaining portion is fit to the terminal retaining portion.

According to a second aspect of the present invention, in the board connecting connector, the board supporting portion may be provided on the opposite side at least to the contacting side in the longitudinal direction of the board.

According to a third aspect of the present invention, in the board connecting connector, the board supporting portion may be provided along the longitudinal direction of board.

According to the third aspect of the present invention, the board supporting portion is provided along the longitudinal direction of the board, so that it is achievable to support the board in more stable state.

According to a fourth aspect of the present invention, the fitting fixing portion may include a fitting space, a dimension of which becomes smaller as it goes from the contacting side to the opposite side.

According to the fourth aspect of the present invention, in the board connecting connector, it is achievable to accommodate the board from the contacting side towards the opposite side, so that it is easy to waterproof and is possible to simplify the configuration.

According to a fifth aspect of the present invention, in the board connecting connector, the fitting space may be formed in the thickness direction of the board.

According to a sixth aspect of the present invention, in the board connecting connector, the board may have a protruding portion that protrudes outward in the width direction of the board and the fitting space may be provided at positions corresponding to the protruding portion of the board.

According to a seventh aspect of the present invention, in the board connecting connector, the board retaining portion may have a tapered portion, which is located on a center side of the board than the fitting space in the width direction of the board and has a smaller dimension as it goes from the contacting side to the opposite side while keeping greater distance than the fitting space in the thickness direction of the board.

According to the seventh aspect of the present invention, in the board connecting connector, it is achievable to easily guide the board to the board supporting portion by the tapered portion.

According to an eighth aspect of the present invention, in the board connecting connector, the fitting space may be formed in the width direction of the board.

According to a ninth aspect of the present invention, the fitting fixing portion may include a fitting space that has smaller dimension as it goes from the opposite side to the contacting side.

According to the ninth aspect of the present invention, in the board connecting connector, it is possible to accommodate the board from the opposite side towards the contacting side. Accordingly, there is no need to provide the protruding portions on the board. Therefore, it is not necessary to use a special board.

According to a tenth aspect of the present invention, in the board connecting connector, the fitting space may be formed in at least one of thickness direction and width direction of the board.

According to the tenth aspect of the present invention, in the board connecting connector, it is achievable to accommodate the board from the opposite side towards the contacting side. Accordingly, it is possible to provide the fitting space in either of thickness direction or width direction.

According to an eleventh aspect of the present invention, in the board connecting connector, the fitting space may be formed to be tapered.

According to the eleventh aspect of the present invention, in the board connecting connector, since the fitting space is tapered, it is achievable to smoothly press the board in.

According to a twelfth aspect of the present invention, in the board connecting connector, when the board retaining portion and the terminal retaining portion are in a state of fitting to each other, the board supported by the board retaining portion is pinched in the thickness direction of the board between the contact portions of the terminals provided on one side of the terminal retaining portion and the contact portions of the terminals provided on the side facing to the one side of the terminal retaining portion and thereby the terminal portions provided on the board surface of the board and the contact portions of the terminals.

According to the present invention, it is achievable to provide a board connecting connector, which can surely position the board in the board retaining portion, and thereby stabilizes the contact between the board and the terminals during fitting between the board retaining portion and the terminal retaining portion.

BRIEF DESCRIPTION OF THE DRAWINGS

FIGS. 11(a) and 11(b) are front views showing the board retaining portion according to the embodiment of the present invention, in which FIG. 11(a) shows the board retaining portion with the board accommodated therein and FIG. 11(b) shows the board retaining portion without the board;

FIGS. 12(a) and 12(b) are sectional views showing the board retaining portion according to the embodiment of the present invention, in which FIG. 12(a) is a sectional view taken at a line A-A in FIG. 11(b) and FIG. 12(b) is a sectional view taken at a line B-B in FIG. 11(b);

DETAILED DESCRIPTION OF THE PREFERRED EMBODIMENTS

Hereunder, an embodiment of the present invention will be described with reference to the accompanying drawings.

Figure 1:
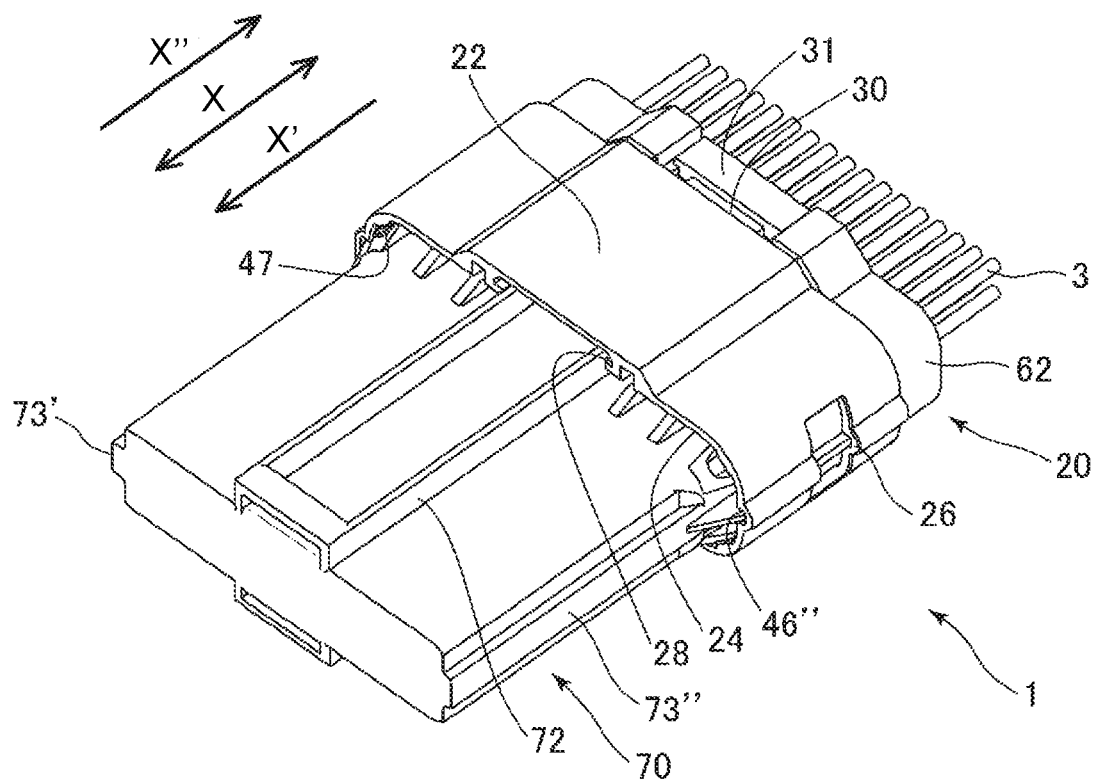
FIG. 1 is a perspective view showing a board connecting connector after fitting according to an embodiment of the present invention.
Figure 2:
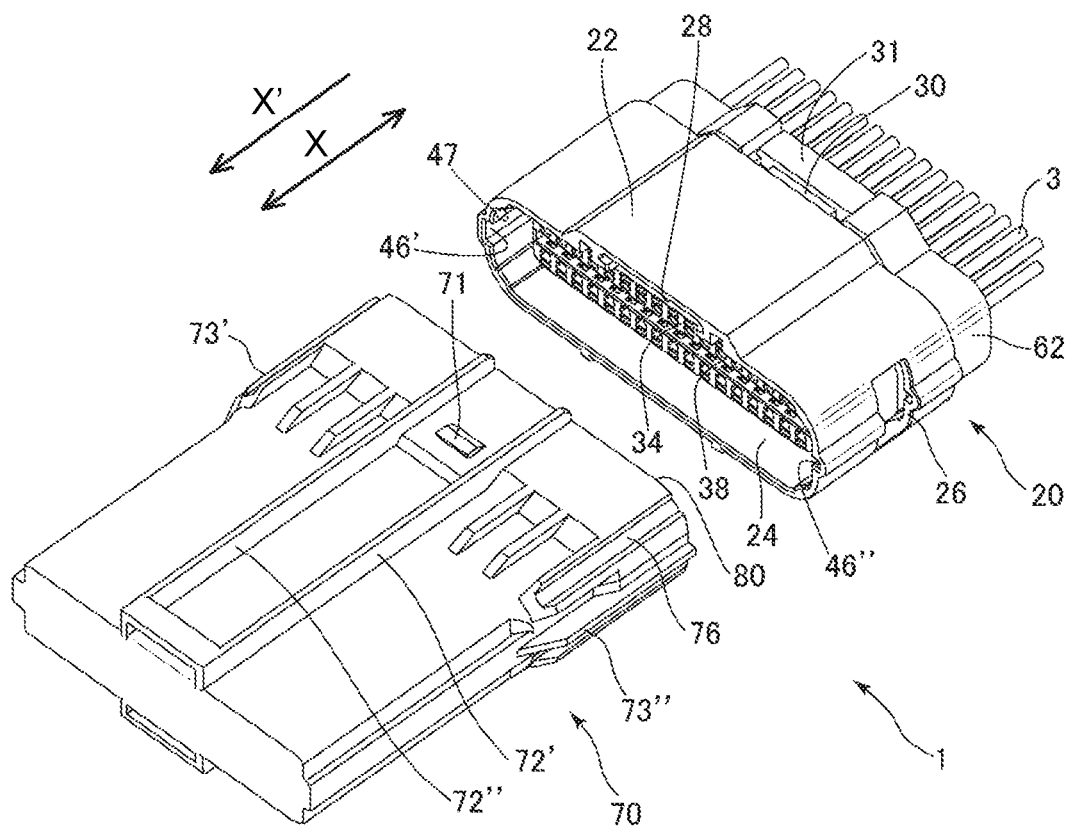
FIG. 2 is a perspective view showing the board connecting connector before fitting according to the embodiment of the present invention.

FIGS. 1 and 2 are perspective views showing a board connecting connector 1 according to an embodiment of the present invention. In FIGS. 1 and 2, terminals 90 and cables 3 are also illustrated, in which cables are connected to one ends of the terminals. The board connecting connector 1 is composed of a combination of a terminal retaining portion 20 and a board retaining portion 70. The terminal retaining portion 20 accommodates terminals 90.

In the embodiment, the board retaining portion 70 accommodates a board 10. The terminal retaining portion 20 and the board retaining portion 70 can face each other to fit to each other in a front-and-back direction (in a direction indicated with Arrow X in the figures). FIG. 1 shows the fitted state and FIG. 2 shows the state before fitting.

In the embodiment, the terminal retaining portion 20 includes a main body 22 and a rear cover 62. The main body 22 is made of resin. The rear cover 62 is made of resin and is to be attached to a rear part of the main body 22. The main body 22 has a tubal shape without end surfaces, having a section of a generally flattened circular shape as a whole. A front side of the rear cover 62 has a section having a generally flattened circular shape, corresponding to the shape of a rear part of the main body 22. The cables 3 are attached to the rear side of the main body 22, while being in a state so as to be able to insert, and close the rear part of the main body 22.

On a front side of the main body 22, there is an insertion opening 24 to insert the board retaining portion 70. Furthermore, inside the insertion opening 24, there is provided a terminal arrangement portion 34. The terminal arrangement portion 34 extends in a direction of Arrow X' (a direction from a back side to the front side in the front-and-back direction) within the insertion opening 24.

In the embodiment, the terminal arrangement portion 34 includes a plurality of terminal insertion portions 48. The terminal insertion portions 48 extend in the front-and-back direction indicated with Arrow X and are stack in two stories in an up-and-down direction (a thickness direction of the terminal retaining portion 20). With the space formed between the upper story of the terminal insertion portions 48 and the lower story of the terminal insertion portions 48, there is formed a board insertion portion 38.

In the embodiment, the board retaining portion 70 is made of resin, similarly to the terminal retaining portion 20 and the rear cover 62. The board retaining portion 70 has a generally tubal shape having an end surface. The board retaining portion 70 has a generally flattened circular shape on the front side, and the rest part thereof has a section of a generally rectangular flattened shape.

In the embodiment, the front side of the board retaining portion 70 having a generally flattened circular section can be used as accommodating space to accommodate the terminal arrangement portion 34. When the terminal retaining portion 20 and the aboard retaining portion 70 are fitted to each other, the board retaining portion 70 is inserted through the insertion opening 24 of the terminal retaining portion 20. Into the accommodating space 80 of the board retaining portion 70, the terminal arrangement portions 34 are accommodated.

In order to determine a fitting direction of the terminal retaining portion 20 and the board retaining portion 70, there are provided total three sets of fitting direction determining means on the terminal retaining portion 20 and the board retaining portion 70.

More specifically, on two round facing inner walls of the terminal retaining portion 20, there are formed guiding ridges 47. The ridges 47 extend along the front-and-back direction X from a front end to near an insertion position of the terminal retaining portion 20. Corresponding to those ridges 47, there are provided guiding grooves 76, which extend along the front-and-back direction X from the front end to near insertion position of the board retaining portion 70 on upper and lower left and right outer walls of the board retaining portion 20.

In addition, on the left and right inner walls of the terminal retaining portion 20, there is provided a pair of guiding grooves 46' and 46". The pair of guiding grooves 46' and 46" extends in the front-and-back direction from the front end to near the insertion position of the terminal retaining portion 20. Corresponding to those guiding grooves 46' and 46", on upper and lower left and right walls of the board retaining portion 70, there is provided a pair of guiding ribs 73' and 73".

Furthermore, on an inner wall of an upper part of the terminal retaining portion 20, there is provided a guiding space 28. The guiding space 28 extends in the front-and-back direction X from a front end to near the insertion position of the board retaining portion 70 and has a certain width. Corresponding to the guiding space 28, there is provided a pair of guiding ribs 72' and 72" on an outer wall of an upper part of the board retaining portion 70. The guiding ribs 72' and 72" extends in the front-and-back direction X from a front end to near the insertion position of the board retaining portion 70. Here, a width between the rib 73' and the rib 73" is set to be generally the same as or slightly smaller than that of the space 28.

Upon inserting the board retaining portion 70 in the terminal retaining portion 20, it is necessary to match the ridges 47 of the terminal retaining portion 20 to grooves 76 of the board retaining portion 70, the grooves 46 of the terminal retaining portion 20 to the ribs 73 of the board retaining portion 70, and the space 28 of the terminal retaining portion 20 to the ribs 72 of the board retaining portion 70, respectively. With this procedure, it is achievable to determine the fitting direction of the board retaining portion 70 to the terminal retaining portion 20, and easily accommodate the terminal arrangement portions 34 in the accommodating space 80 of the board retaining portion 70.

Furthermore, as for the upward/downward direction of the board retaining portion 70 relative to the terminal retaining portion 20, it is also possible to set the sizes to be different between the groove 46' and the groove 46", and have the sizes of the rib 73' and the rib 73" correspond to those sizes of the grooves 46' and 46", so as to prevent erroneous insertion. For example, in the illustrated example, the sizes of the groove 76' and the rib 73' are set greater than those of the groove 46" and the rib 73", so as to prevent erroneous insertion of the board accompanying member 70 to the terminal accompanying member 20.

Needless to say, alternatively, in order to prevent erroneous insertion, it is also possible to provide a function of preventing an erroneous insertion on the ridges 47 and the grooves 76 by a similar method. Here, the configurations of the ridges 47, the grooves 46, and the spaces 28 provided on the terminal retaining portion 20 and the configurations of the grooves 76, the ribs 73, and the ribs 72 provided on the board retaining portion 70 also serve for enhancing the strength of the terminal retaining portion 20 and the board retaining portion 70.

In order to lock the fitted state of the terminal retaining portion 20 and the board retaining portion 70, it is also possible to provide a locking mechanism. On an outer wall provided on the front side of the board retaining portion 70, there is provided a locking protruding portion 71. Corresponding to the locking protruding portion 71, there is provided a corresponding locking protruding portion 30' inside the terminal retaining portion 20. The corresponding locking protruding portion 30' is well illustrated in FIG. 5, which will be described later. The corresponding locking protruding portion 30' can be operated with locking operation portion 31. The locking operation portion 31 is provided on an upper-side surface of the rear cover 62, while being exposed therefrom to outside.

Figure 3:
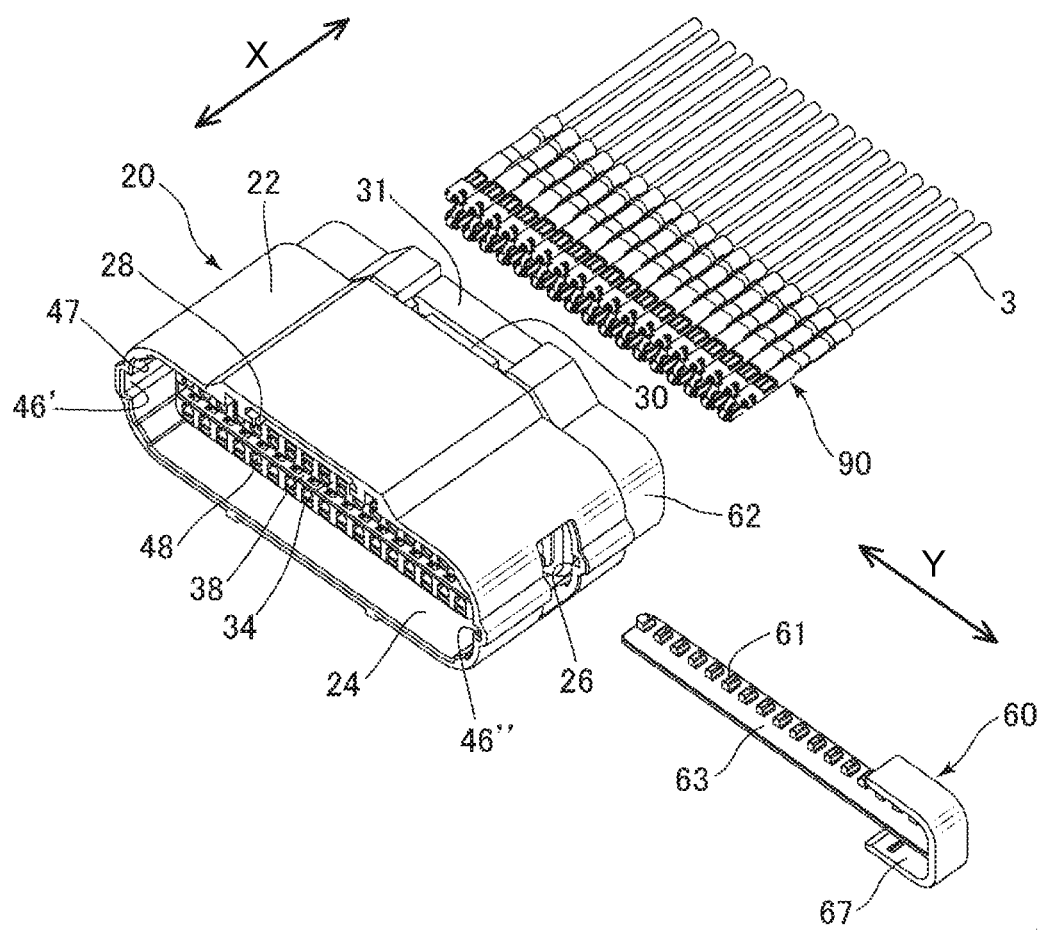
FIG. 3 is a perspective view showing a terminal retaining portion of the board connecting connector according to the embodiment of the present invention.

FIG. 3 is a perspective view showing the terminal retaining portion 20 of FIGS. 1 and 2. Especially in this figure, a retainer 60 and the terminals 90 are removed from the terminal retaining portion 20. As shown in the figure, the terminals 90 are freely attachable/detachable from the terminal retaining portion 20. The retainer 60 includes a holding portion 67 and a bar 63. The holding portion 67 is formed in a generally C-shape. The bar 63 extends from the holding portion 67.

In the embodiment, the retainer 60 is inserted/removed in a direction (indicated with Arrow Y), which is perpendicular to the front-and-back direction indicated with Arrow X, in/from the terminal retaining portion 20 through a retainer insertion opening 26 provided on a side surface of a main body of the terminal retaining portion 20. Once the retainer 60 is inserted, certain parts of the terminals 90 inserted in the terminal insertion portions 48 of the terminal retaining portion 20 engage with small protruding portions 61 provided on the bar 63 of the retainer 60, and thereby it is achievable to prevent coming off of the terminals 90 from the terminal insertion portions 40.

Figure 4:
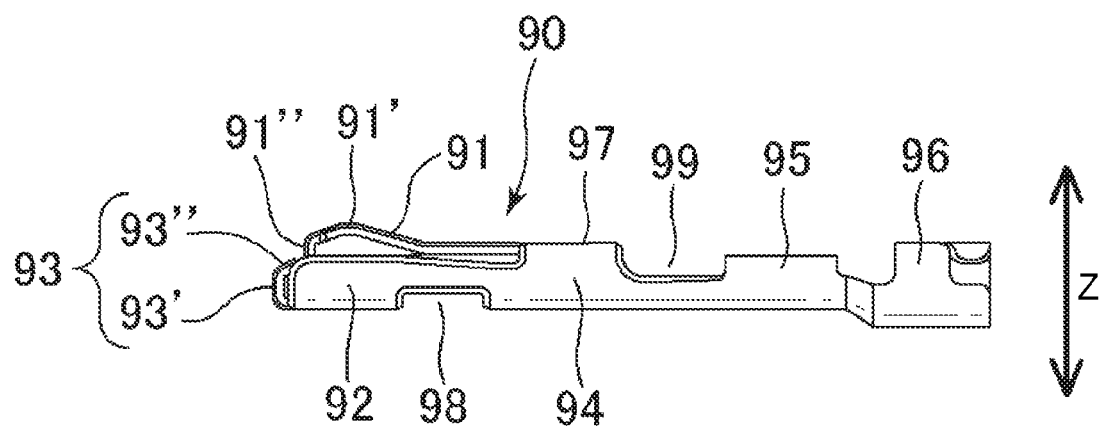
FIG. 4 is a side view showing a terminal of the board connecting connector according to the embodiment of the present invention.
Figure 5:
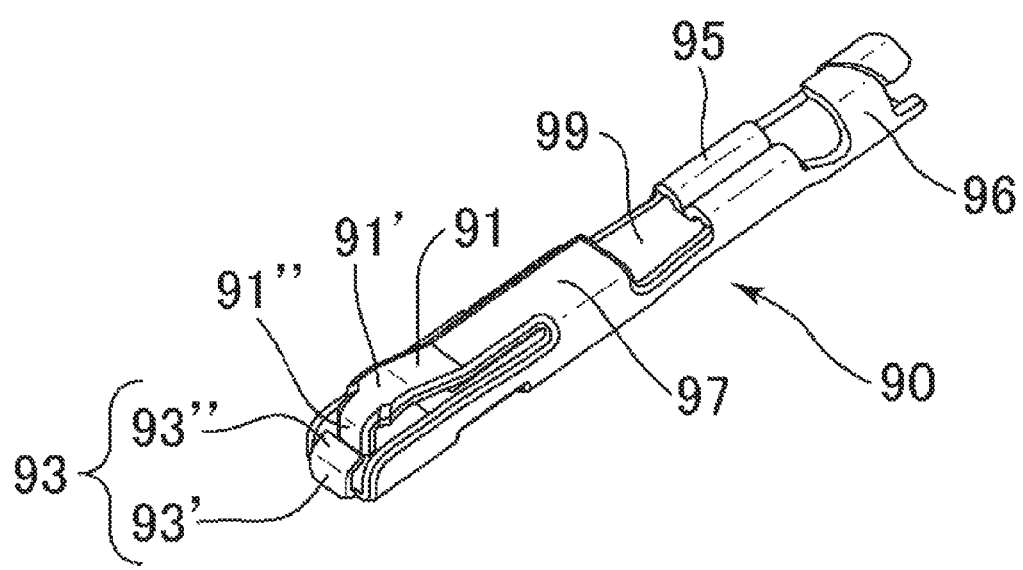
FIG. 5 is a top perspective view showing the terminal of the board connecting connector according to the embodiment of the present invention.
Figure 6:
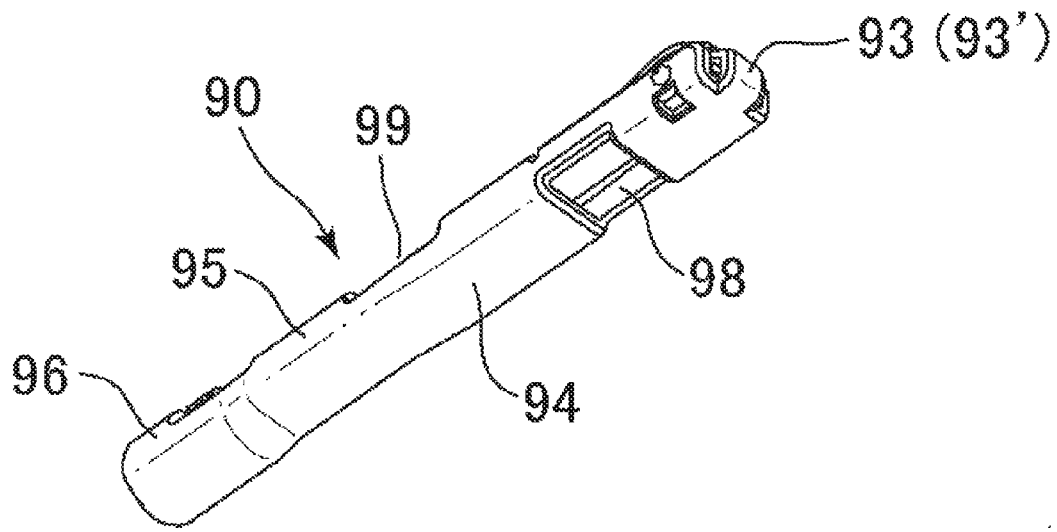
FIG. 6 is a bottom perspective view showing the terminal of the board connecting connector according to the embodiment of the present invention.

Referring to FIGS. 4 through 6, the configuration of the terminals 90 will be described. FIG. 4 is a side view of the terminal 90. FIG. 5 is a top perspective view of the terminal 90. FIG. 6 is a bottom perspective view of the terminal 90.

Each of the terminals 90 includes a main body 94 and an inspection portion 93. The main body 94 is made by rolling one sheet of sheet metal into generally rectangular tube as a whole. The inspection portion 93 is to contact with an inspection jig. The tubular main body 94 includes an elastically displaceable portion 91, and a concave portion 98 for a lance 44, and a concave portion 99 for the retainer 60. The elastically displaceable portion 91 has a contact portion 91'. The concave portion 98 for lance 44 is for engaging with a lance 44 provided on the terminal arrangement portion 34. The concave portion 99 for the retainer 60 is to hook the small protruding portion 61 of the retainer 60.

In the embodiment, the elastically displaceable portion 91 is formed by providing a notch on one tubular surface 97, which is on the upper side of the main body 94. The elastic displaceable portion 91 has a contact portion 91' formed by bending upward (in a direction to be away from the main body 94) into an inverse V-shape. In order to enhance the strength, an end 91" of the contact portion 91' is bent downward so as to direct inward of the main body 94. The contact portion 91' can elastically displace inward of the main body 94 due to the action of the elastically displaceable portion 91.

As described above, the main body 94 is formed as a tubular shape so as to be able to form on a surface with enhanced strength than a simple sheet surface. As a result, the strength around the elastic displaceable portion 91 is very high, and is fully resistible against the elastically displacing motion of the elastic displaceable portion 91.

In the embodiment, the inspection portion 93 includes a vertical part 93' that contacts with an inspection jig. In order to enhance the strength against the inspection jig, the inspection portion 93 can further includes a bent portion 93", which is formed by bending an end of the vertical part 92' towards the elastically displaceable portion 91. The inspection portion 93 is formed, for example, by generally vertically bending a part of sheet metal that forms the tubular main body 94 in a direction to close one opening of the main body.

As a result, the inspection portion 93 and the tubular surface that forms the main body 94 are formed on different surfaces. Providing the inspection portion on a different surface from the tubular surface that forms the main body 94, it is achievable to solve a problem of contact between the contact portion 91' of the elastically displaceable portion 91 and the board upon inspecting the terminal 90 as will be described below. Upon inspecting the terminal 90, an inspection jig is pressed onto the inspection portion 93.

As a result, through the contact between the inspection portion 93 and the inspection jig, load is applied onto the terminal 90, and there is a concern of adversely affecting the contact between the contact portion 91' of the elastically displaceable portion 91 and the board. Moreover, upon inspection of the terminal 90, through contact with the inspection jig, dust or other foreign substances may adhere to the contact portion 91'.

As a result, there is a risk of contact failure. The board connecting connector, which is a connector of interest in this invention, is intended to be used, for example, in an automobile. The contact between the terminal portion 13 of the board 10 and the contact portion 91' of the terminal 90 is very sensitive, and could significantly affect control of engine, brake, etc. of the automobile. Therefore, it is very important to keep stability and secureness of the contact between the terminal portion 13 and the contact portion 91.

In the embodiment, the inspection portion 93 is provided on a different surface from the tubular surface that forms the main body 94. As a result, it is achievable to keep the contact part between the contact portion 91' of the elastically displaceable portion 91 and the board 10 away from the contact portion to contact with the inspection jig, and thereby it is achievable to effectively solve the above-described problem.

The concave portion 98 for the lance 44 has a notch on one tubular surface, which is on the opposite side to the elastically displaceable portion 91 in a thickness direction of the terminal 90, a direction indicated with Arrow Z, which also corresponds to a thickness direction of the board 10. In other word, the concave portion 98 for the lance 44 has a notch on one tubular surface, on the lower side of the main body 94. The concave portion 99 for the retainer 60 is provided behind the concave portion 98 for the lance 44 in a longitudinal direction of the terminal 90.

Similarly to the elastically displaceable portion 91, the concave portion 99 for the retainer 60 has a notch on the upper side of the tubular surface of the main body 94. Both of the concave portions 98 and 99 are provided such that the notches thereof extend to the side wall 92 of the main body 94. Furthermore, a core wire-holding portion 95 and an outer shell-holding portion 96 are provided behind the concave portion 99 for the retainer 60 in the longitudinal direction of the terminal 90.

In the embodiment, the core wire-holding portion 95 is to hold core wire (not illustrated) of the cable 3. The outer shell-holding portion 96 is to hold an outer core (not illustrated) of the cable 3. Especially, for the core wire-holding portion 95, in order to enhance the strength, the core wire-holding portion 95 is bent to form two semicircular sectional parts on the same side as the elastically displaceable portion 91 in the thickness direction Z.

Figure 7:
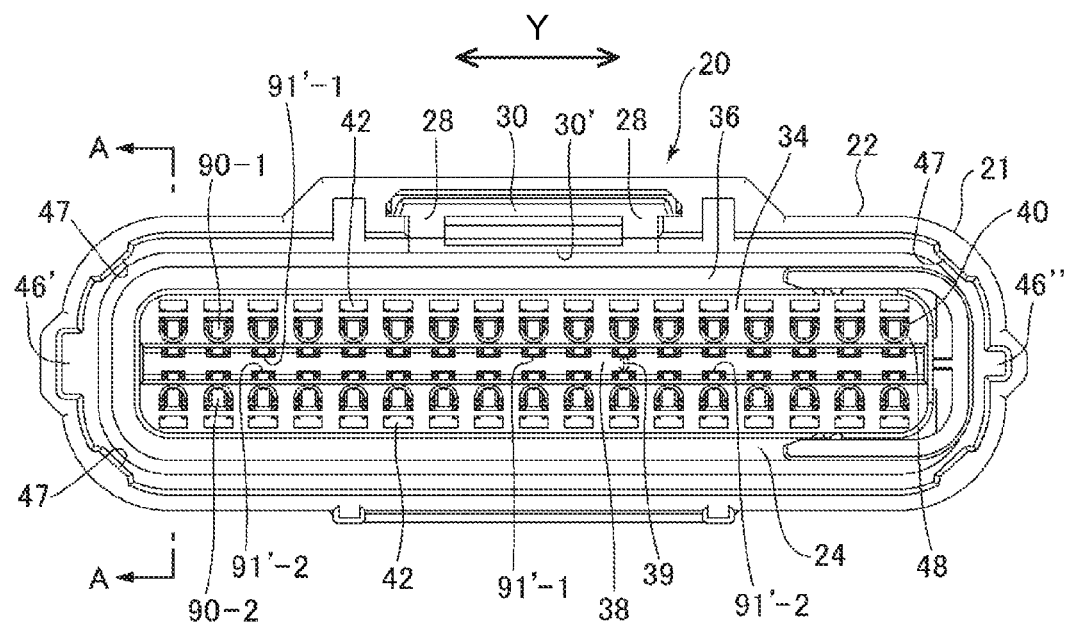
FIG. 7 is a front view showing the terminal retaining portion of the board connecting connector according to the embodiment of the present invention.
Figure 8:
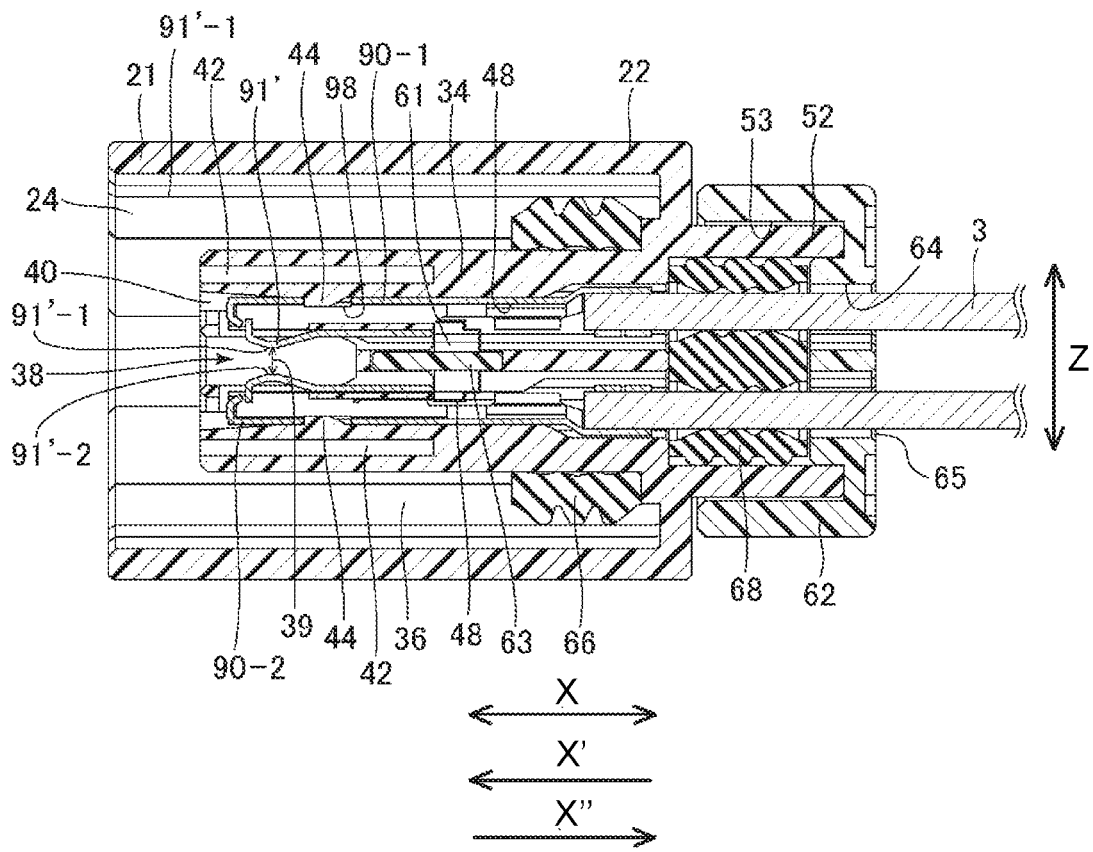
FIG. 8 is a sectional view showing the terminal taken at a line A-A in FIG. 4 according to the embodiment of the present invention.

FIG. 7 is a front view of the terminal retaining portion 20. FIG. 8 is a sectional view of FIG. 7, taken at a line A-A. On a front surface of the terminal arrangement portion 34, there is provided a plurality of windows 40 to expose the inspection portions 93 of the terminals 90, which are inserted in the terminal insertion portions 48.

In the embodiment, the windows 40 are used as inspection windows to allow access to the inspection portions 93 of the respective terminals 90. Those windows 40 are provided on the front surface of the terminal arrangement portion 34, i.e., on the side of fitting between the board retaining portion 70 and the terminal retaining portion 20. Therefore, it is not necessary to form an opening other than the one on the fitting side. As a result, it is easy to apply waterproofing measures on the terminal accommodating portion 20.

In the terminal arrangement portion 34, there are provided spaces 42, which extends in the front-and-back direction X, being parallel to the terminal insertion portions 48. The space 42 can be used as moving spaces of the lances 44, which prevent the terminals coming off from the terminal insertion portions 48 when the terminals 90 are inserted therein. The terminals 90 are inserted in the terminal insertion portions 48 along the direction indicated with Arrow X'. At this point, the lances 44 displace towards the spaces 42 through contact with the front side of the terminals 90, and then engage with the concave portions 98 for the lances 44.

As a result, the terminals 90 are prevented from coming off from the terminal insertion portions 48. Furthermore, as for the terminals 90 in the upper stage of the terminal insertion portions 48, the small protruding portions 61 provided on the bar 63 of the retainer 60 hook onto the concave portions 99 for the retainer 60 of the terminals 90 and thereby the terminals 90 are prevented from coming off from the terminal insertion portions 48.

In case of the board insertion portion 38 provided on the front side of the terminal arrangement portion 34, the contact portions 91'-1 of the terminals 90 provided on the upper story of the terminal insertion portions 48 and the contact portions 91'-2 of the terminals 90 provided in the lower story of the terminal insertion portions 48, which are provided so as to face the upper story of the terminal insertion portions 48, protrude in direction so as to get close to each other, and a space 39 is formed therebetween.

Figure 9:
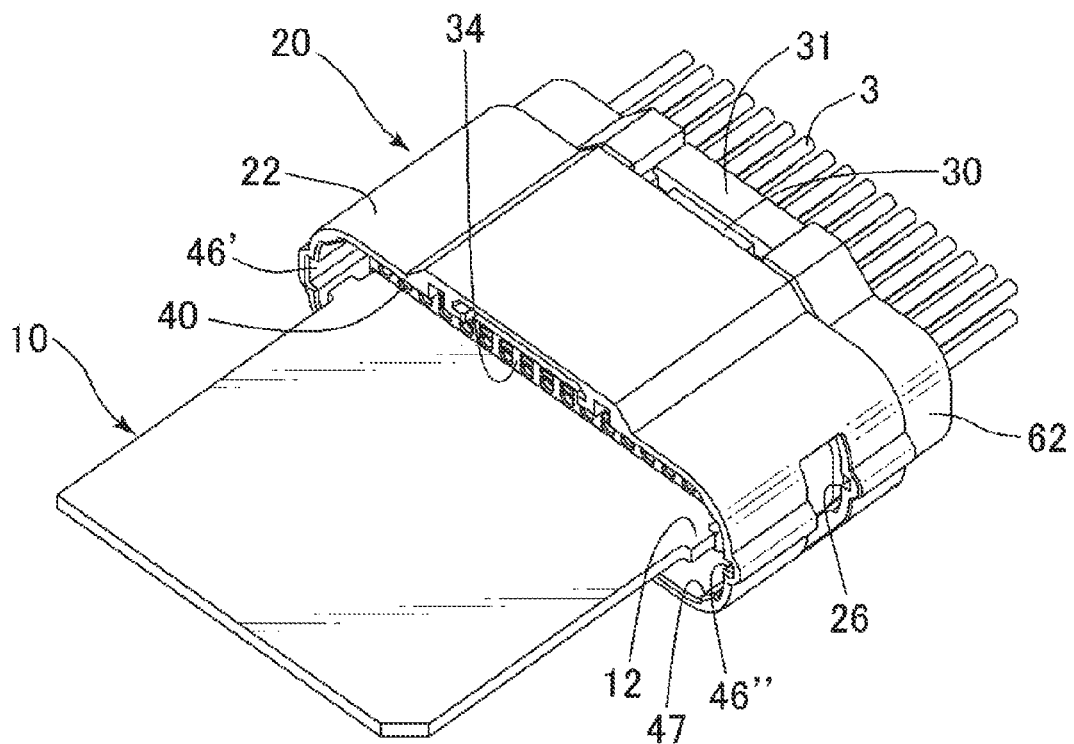
FIG. 9 is a perspective view showing the board connecting connector with the board retaining portion being removed according to the embodiment of the present invention.

When the terminal retaining portion 20 and the board retaining portion 70 are in the fitting state, the board 10 supported by the board retaining portion 70 is pinched in the space 39 in the thickness direction Z of the board 10. As a result, the terminal portions provided on a sheet surface of the board 10 elastically contact with the contact portions 91' of the terminals 90. For convenience, FIG. 9 shows the state, in which the board retaining portion 70 is removed in FIG. 1.

Here, needless to say, the state of "facing" includes that the state where contact portions of the terminals 90 in the upper story of the terminal insertion portions 48 and the terminals 90 in the lower story of the terminal insertion portions 48 are staggered from each other in a terminals' pitch direction as well as the state where the terminals 90 are completely overlapped in the up-=and-down direction, i.e., in the thickness direction Z of the terminals 90 and the board 10. The terminals 90 arranged on the upper side and the terminals 90 on the lower side can face each other in any way as long as they form the space 39 to pinch the board 10, by using contact portions of either upper or lower story of the terminals 90.

In order to enhance waterproofing, it is preferred to provide an annular waterproof packing on an outer circumference of the terminal arrangement portion 34. When the terminal accommodating portion 34 is accommodated in the accommodating space 80 of the board retaining portion 70, at the same time, the waterproof packing 66 will be taken inside of the accommodating space 80. With the waterproof packing 66, a space between the outer circumference of the terminal arrangement portion 34 and an inner circumference of the board retaining portion 80 is filled. As a result, it is achievable to completely waterproof the board retaining portion 70 and the front side of the terminal arrangement portion 34.

In addition, upon attaching the rear cover 62 to a cover attachment portion 52 formed at a rear part of the main body 22, it is preferred to provide a waterproof packing 68 around cables 3. With the waterproof packing, it is achievable to fill the space between the outer circumference of the cables 3 and the inner wall 53 of the cover attachment portion 52.

In addition, it is also achievable to prevent water entry from the terminal insertion portions 48 through the insertion holes 64. As a result, it is achievable to completely waterproof the rear side of the terminal arrangement portion 34.

Figure 10:
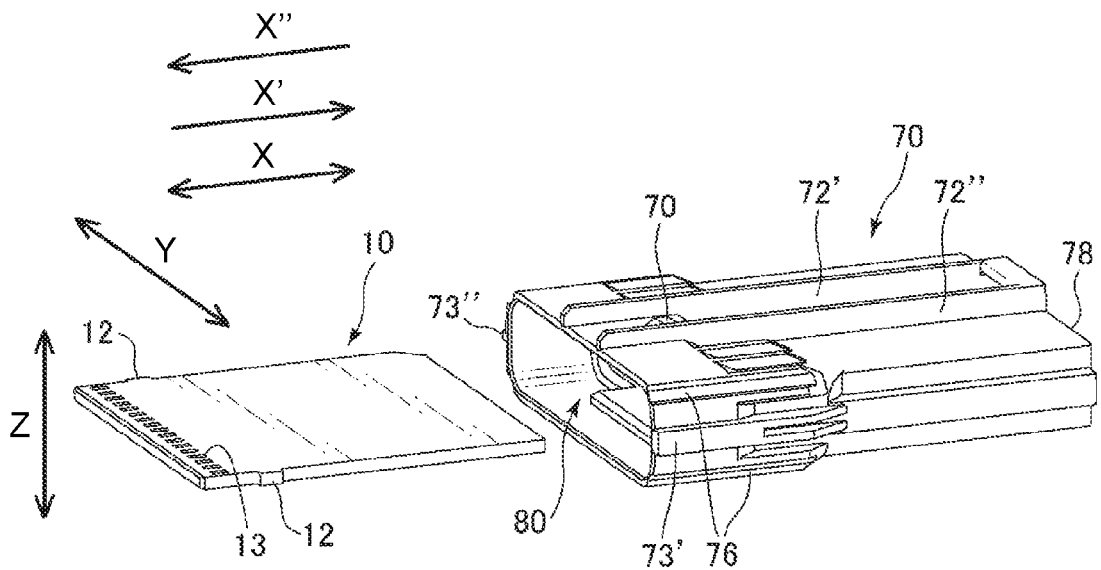
FIG. 10 is a perspective view showing the board retaining portion with the board being removed according to the embodiment of the present invention.
Figure 11:
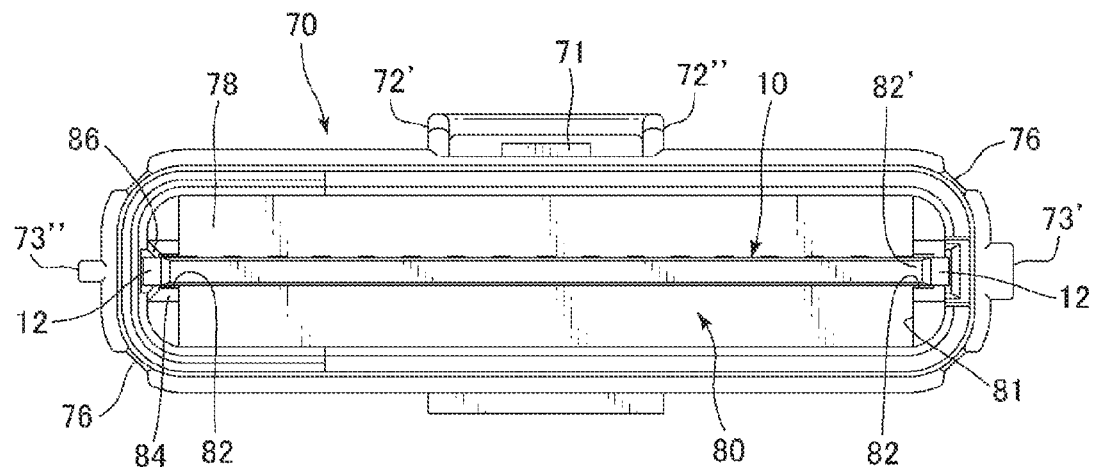
Figure 11:
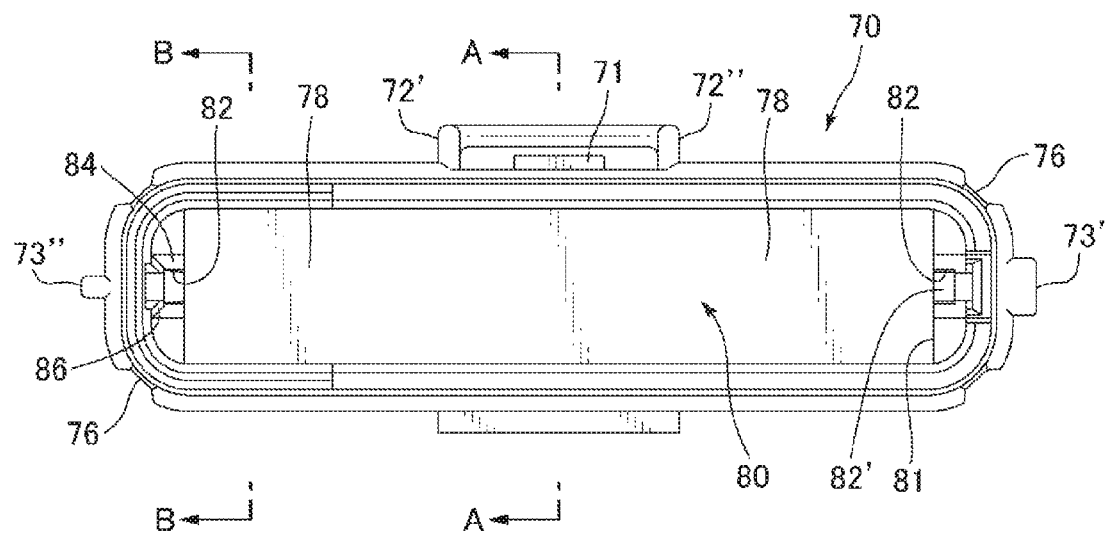

FIG. 10 is a perspective view showing the board retaining portion 70 of FIGS. 1 and 2, in which the board 10 is removed from the board retaining portion 70. FIG. 11(a) is a front view of the board retaining portion 70. FIG. 11 (b) is a front view showing the board retaining portion 70, in which the board 10 is removed from the board retaining portion 70.

Figure 12:
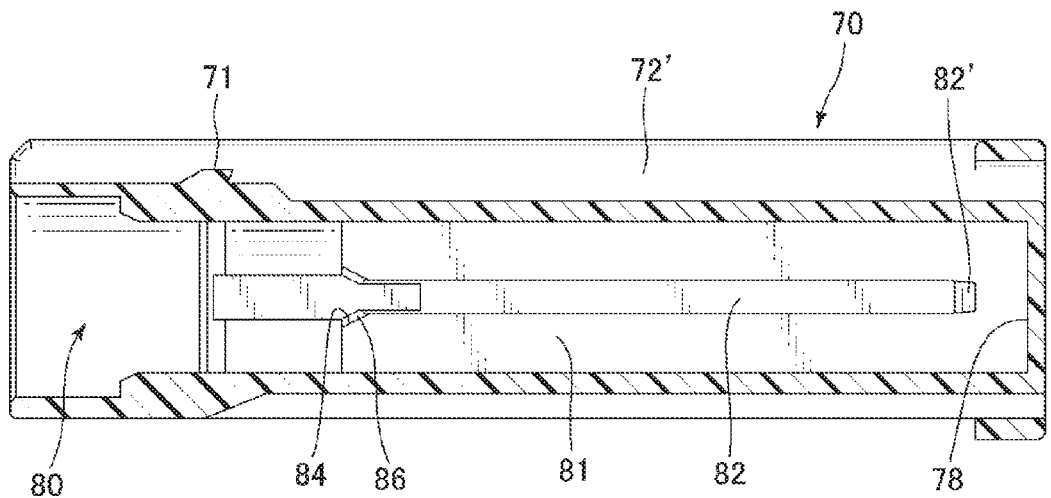
Figure 12:
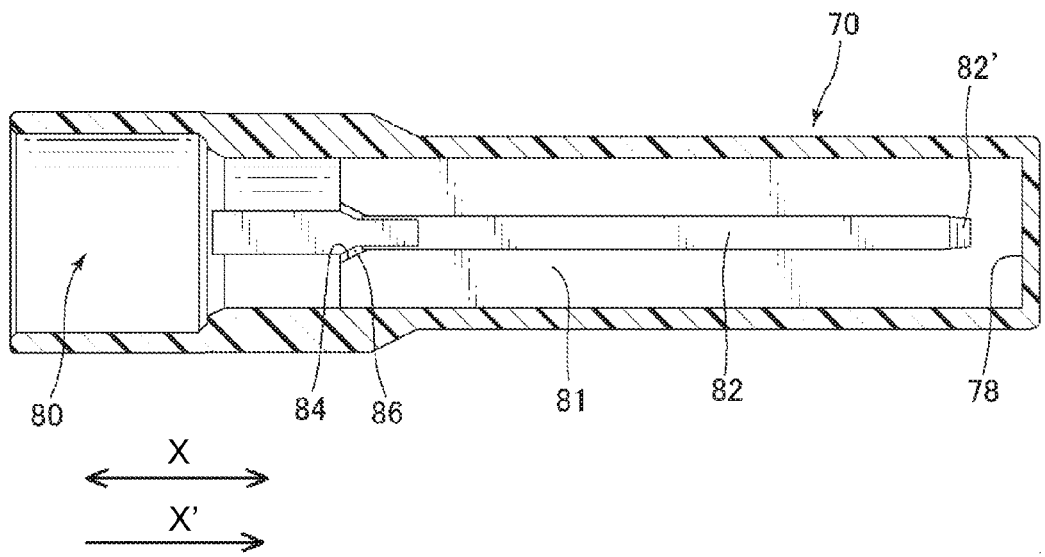
Figure 13:
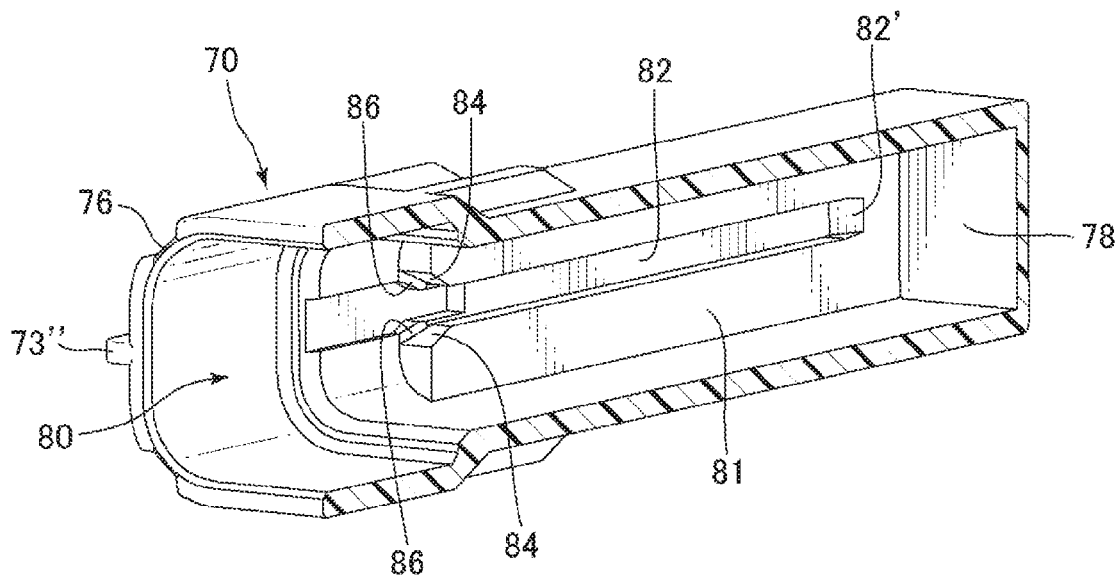
FIGS. 13(a) and 13(b) are perspective views showing the board retaining portion according to the embodiment of the present invention.
Figure 13:
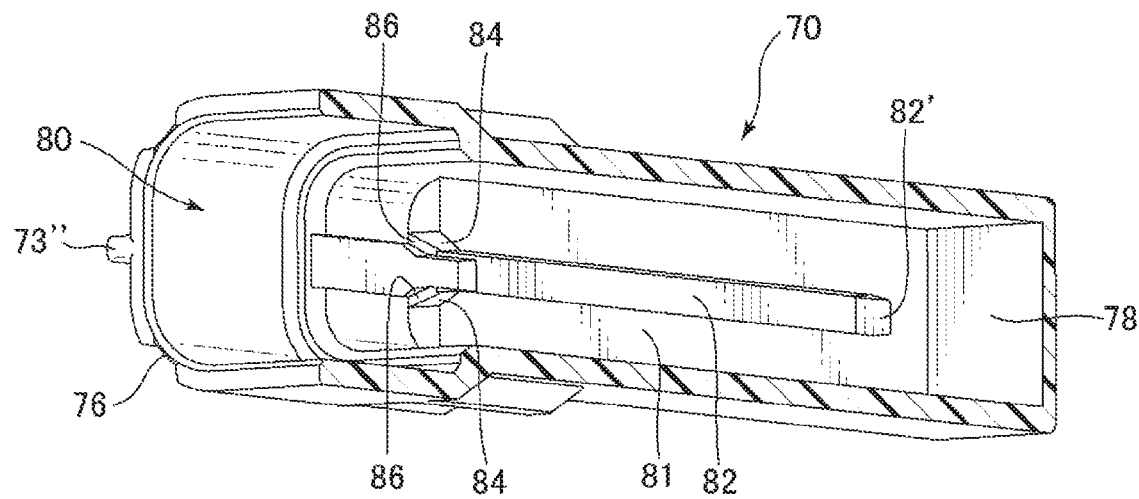
Figure 14:
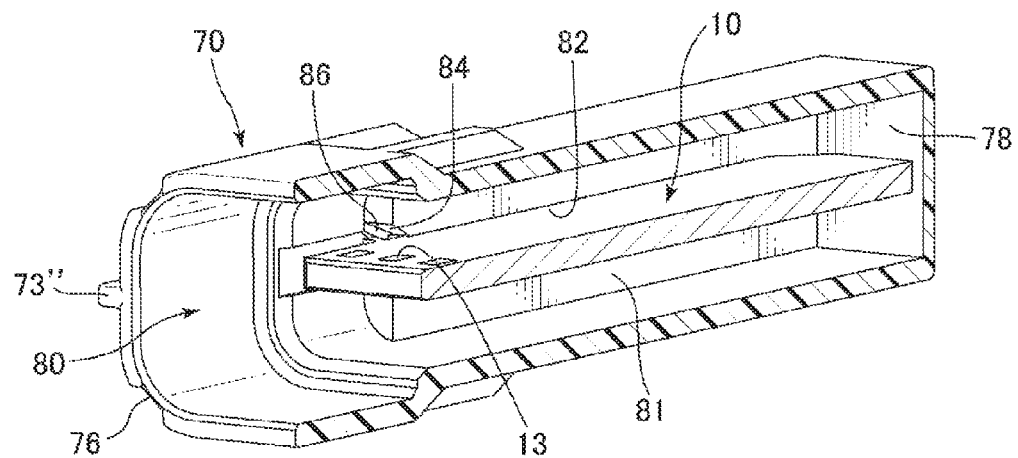
FIGS. 14(a) and 14(b) are perspective views showing the board retaining portion with the board inserted therein according to the embodiment of the present invention.
Figure 14:
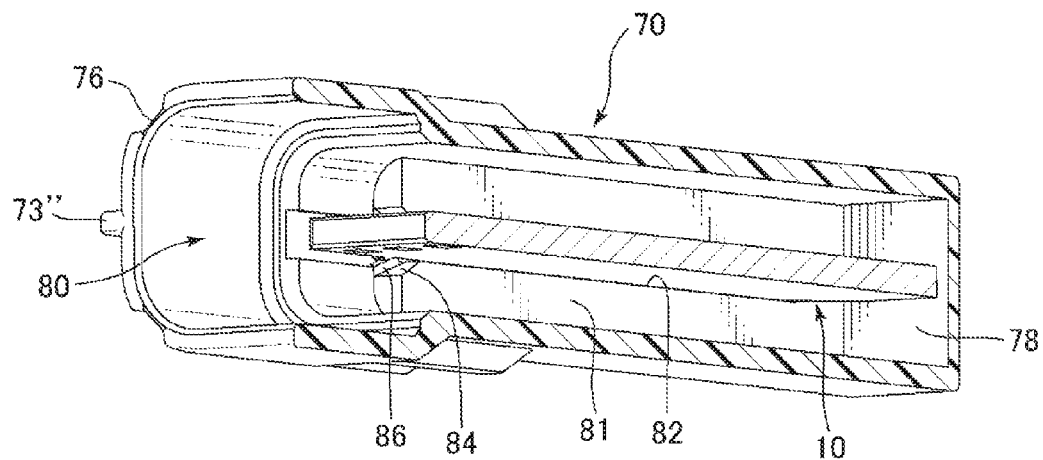

FIG. 12(a) is a sectional view of FIG. 11(b), taken along a line A-A, and FIG. 12(b) is a sectional view of FIG. 11 (b), taken along a line B-B. FIGS. 13(a) and 13(b) are perspective views showing the board retaining portion 70 of FIG. 11(b). FIGS. 14(a) and 14(b) are perspective views showing the board retaining portion 70 of FIGS. 13(a) and 13(b), into which a board 10 is inserted.

In the embodiment, the board retaining portion 70 includes fitting fixing portions 86 and a board supporting portion 82. The board 10 is secured and supported by the fitting fixing portions 86 and the board supporting portion 82. Then, resin (not illustrated) is injected into the board retaining portion 70. As a result, the board 10 is completely secured inside the board retaining portion 70.

In the embodiment, the fitting fixing portions 86 are for securing the board 10 by pressing in. The fitting fixing portions 86 are provided on the side that the terminal portions 13 contact with the contact portions 91' of the terminals 90. Here, instead of simply supporting and securing, in the embodiment, the board 10 is pressed in and secured, so that it is achievable to more surely position the board 10.

In the embodiment, the board connecting connector 1, which is the connector of interest in this invention, is assumed to use in, for example, automobiles. Therefore, the board and the connector will be highly possibly exposed to vibrations and high temperatures. Therefore, there is possibility that the contact between the terminal portions provided on the board surface of the board 10 and the contact portions 91' of the terminals 90 becomes unstable.

In addition, upon injecting resin into the board retaining portion 70, there is another concern of displacement of the board 10 in the board retaining portion 70. The contact between the terminal portions 13 of the board 10 and the contact portions 91' of the terminals 90 is very sensitive, and possibly cause significant influence on controls of an engine, brake, etc. of the automobile. Therefore, it is very important to keep stability and secureness of the contact between the terminal portions 13 and the contact portions 91'.

In the embodiment, the board 10 is pressed in and secured on the contacting side, so as to surely position the board 10 in a specified place inside the board retaining portion 70. As a result, it is achievable to ensure the stability and secureness of the contacts.

Being different from the fitting fixing portion, the board supporting portions 82 can be any as long as they can support the board 10. With the resin that will be injected later, the board will be surely secured in the board retaining portion 70. In addition, even when there is certain twisting occurred between the board supporting portion 82 and the fitting fixing portions 86, there is no significant influence on the contact between the terminal portions 13 of the board 10 and the contact portions 91' of the terminals 90, as long as the board 10 is surely positioned with the fitting fixing portions 86.

Therefore, the board supporting portion 82 would work satisfactorily as long as it is provided in a place other than on the contact side. Here, in order to make insertion of the board 10 easy, the board supporting portion 82 is preferably provided at least on the opposite side to the contact side in the longitudinal direction X of the board, and preferably provided along the longitudinal direction of the board 10 as in the illustrated embodiment.

The fitting fixing portions 86 form spaces, each of which has smaller dimension in the thickness direction Z of the board 10 as it goes in the direction indicated with Arrow X', i.e. from the contact side between the terminal portions 13 of the board 10 and the contact portions 91' of the terminals 90 towards the opposite side in the longitudinal direction X of the board 10 to the contact side. Into the spaces formed by the fitting fixing portions 86, protruding portions 12 of the board 10 will be pressed. The protruding portions 12 of the board 10 protrude outward in the width direction Y of the board 10.

In order to achieve smooth pressing in and securing, each of the fitting fixing portions 86 are preferably formed to have a smooth taper. Here, the fitting fixing portions 86 can be any as long as it has a structure that can press in and secure the board 10, e.g., a structure that makes the board contact by pressure at a certain part of the board 10. Therefore, for example, instead of smoothly tapered structure, the space can have step-like structure.

Alternatively, the space formed by the fitting fixing portions 86 can have a structure so as to make the board 10 contact by pressure only from one side in the thickness direction of the board. In addition, it is not necessary to provide the fitting fixing portions 86 in the thickness direction Z of the board 10, and can be provided in the width direction Y.

In order to smoothly guide the protruding portions 12 of the board 10 into the spaces formed by the fitting fixing portions 86, it is also possible to provide another tapered portion 84 at an adjacent position to the tapered fitting fixing portions 86. For example the tapered portion 84 may be provided such that the tapered portion 84 is at a center side of the board 10 than the tapered in the width direction Y, keeps a distance greater than the tapers of the fitting fixing portions 86 in the thickness direction Z of the board 10, and has a small dimension in the direction indicated with Arrow X' similarly to the tapers of the fitting fixing portions 86.

According to the embodiment, the spaces formed by tapers of the fitting fixing portion 86 are formed to have small dimension in the direction indicated with Arrow X'. Therefore, it is possible to insert the board 10 in the same direction. As a result, with this configuration, it is possible to have the board retaining portion 70 at a closed state on the opposite side to the contact side in the longitudinal direction X of the board 10. As a consequence, it is easier to waterproof, and it is achievable to simplify the configuration.

Figure 15:
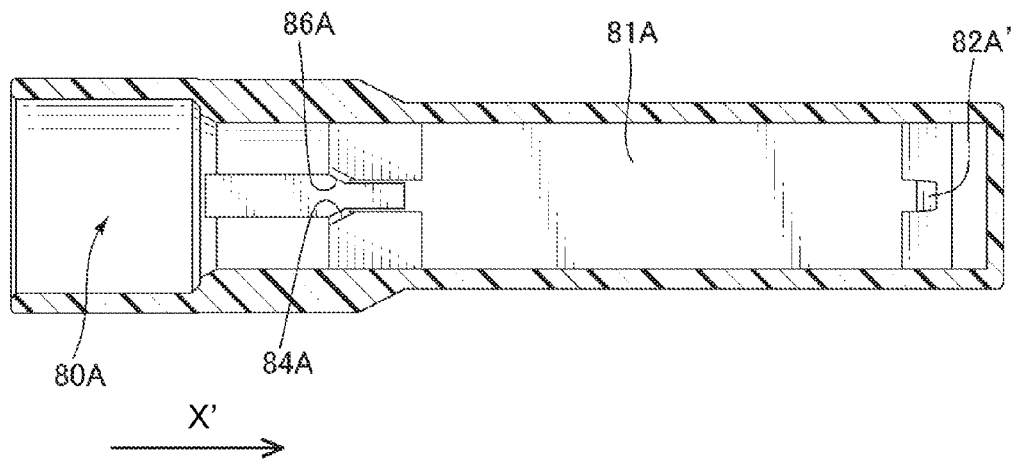
FIG. 15 is a sectional view showing a modification example of a board supporting part of the board retaining portion according to the embodiment of the present invention.

The board supporting portion 82 preferably includes at least a space 82' formed in the width direction Y of the board 10, and further includes a slit 82" formed in the longitudinal direction X of the board 10. FIG. 15 shows a modification example of the board supporting portion 82 that corresponds to FIG. 11(b).

The board supporting portion 82 can be any as long as it can support the board 10. Therefore, as shown in this modification example, omitting the slit 82", only the space 82' can be provided. Here, in FIG. 15, for members corresponding to members in FIG. 11(b), the same reference numerals are used.

Similarly to the fitting fixing portions 86, the space 82' is formed by a taper. The space 82' formed by the taper is formed so as to have smaller dimension in the width direction Y of the board 10 as it goes in the direction indicated with Arrow X'. Upon inserting the board 10 in the direction X', by pressing a part 12 of the board in the width direction Y into the spaces formed by the tapers of the fitting fixing portions 86, it is possible to support the board 10.

Figure 16:
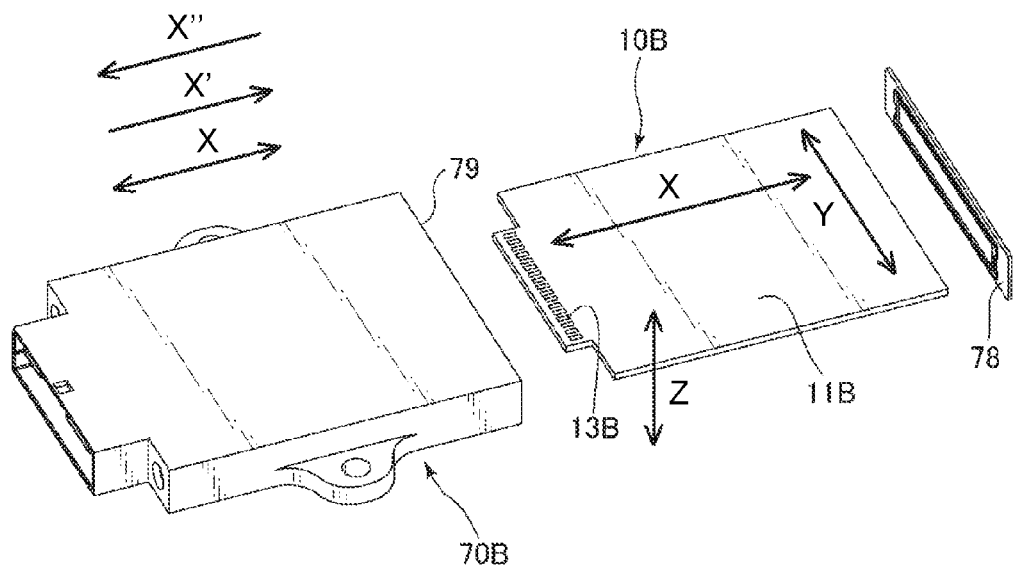
FIG. 16 is a perspective view showing a modification example of the board retaining portion of the board retaining portion according to the embodiment of the present invention.
Figure 17:
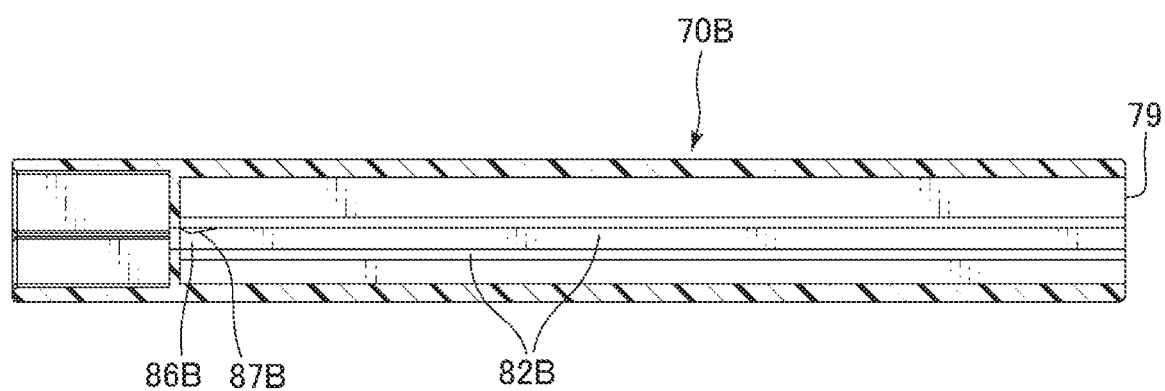
FIG. 17 is a side sectional view showing the modification example of the board retaining portion of the board retaining portion according to the embodiment of the present invention.

FIGS. 16 and 17 show modification examples of the board retaining portion 70B. FIG. 16 is an exploded perspective view of the board retaining portion 70B, which is illustrated with the board 10B. FIG. 17 is a side sectional view of the dissembled board retaining portion 70B.

As shown in those figures, the board retaining portion 70B can be configured so as to cover with the rear cover 78 the opening 79, which is provided at the rear end part on the opposite side to the contact side of contacting between the terminal portions 13 of the board 10 and the contact portions 91' of the terminals 90.

According to this configuration, it is possible to accommodate the board 10 towards the direction indicated with Arrow A". The fitting fixing portions 86 form, for example, a space 86B, with the protruding portion 87B provided on the slit 82B, such that each of the spaces 86B has a smaller dimension as it goes towards the direction indicated with Arrow X". In this case, the space 86B can be provided in any of the thickness direction Z or the width direction Y of the board 10B, and also can be provided on the both directions. In addition, it is not necessary to use a special board such as the board 10 having the protruding portions 12.

According to the embodiment, the thicknesses and widths of the boards 10 and 10B are assumed to be generally constant similarly to typical boards. However, whether it is possible to press in and secure the board 10 or 10B is supposed to be determined based on the relative relation between the thicknesses of the board and the size of the space.

Therefore, it is not always necessary to have the thickness and width of the board constant. For example, it is possible to form a space of certain size on the board retaining portion and change the thickness of a part of the board to press in and secure. For example, it is also possible to thicken a part of the board by applying resin or metal paste and press the board into the board retaining portion to secure at the thickened part. Moreover, according to the embodiment, there is a plurality of terminals provided.

Needless to say, the number of the terminals to provide can be one, too. In addition to those mentioned above, there are various modifications, alterations, and changes within the scope of the present invention. All of those modifications, alterations, and changes shall be included in the scope of the present invention.

The present invention is widely applicable in board connecting type connectors, which fit to contact terminal portions provided on a board surface of the board to contact portions of terminals.

The disclosure of Japanese Patent Applications No. 2015-211030, filed on Oct. 27, 2015, is incorporated in the application by reference.

While the present invention has been explained with reference to the specific embodiments of the present invention, the explanation is illustrative and the present invention is limited only by the appended claims.

What is claimed is:

1. A board connecting connector for connecting a board and a terminal, comprising:
   a board retaining portion for retaining the board; and
   a terminal retaining portion for retaining the terminal,
   wherein said board retaining portion is configured to fit into the terminal retaining portion in a fitting direction so that a terminal portion formed on the board contacts with a contact portion of the terminal at a first location of the board retaining portion when the board retaining portion is fitted into the terminal retaining portion, said board retaining portion includes a fitting fixing portion for fitting and fixing the board, said fitting fixing portion has a first height slightly smaller than a thickness of the board in a thickness direction of the board perpendicular to the fitting direction so that the board is tightly fitted to the fitting fixing portion, said board retaining portion includes a board supporting portion for supporting the board, and said board supporting portion has a second height greater than the first height in the thickness direction perpendicular to the fitting direction so that the board is loosely retained in the board supporting portion.

2. The board connecting connector according to claim 1, wherein said board supporting portion is disposed at a second location opposite to the first location in the fitting direction.

3. The board connecting connector according to claim 1, wherein said board supporting portion extends in the fitting direction.

4. The board connecting connector according to claim 1, wherein said fitting fixing portion includes a fitting space having a size decreasing in the fitting direction.

5. The board connecting connector according to claim 1, wherein said fitting fixing portion includes a fitting space having a size corresponding to a thickness of the board.

6. The board connecting connector according to claim 1, wherein said fitting fixing portion includes a fitting space situated at a location corresponding to a protruding portion of the board.

7. The board connecting connector according to claim 1, wherein said board retaining portion includes a tapered portion having a size greater than a thickness of the board, and said tapered portion has the size decreasing in the fitting direction.

8. The board connecting connector according to claim 1, wherein said fitting fixing portion includes a fitting space extending in a width direction of the board.

9. The board connecting connector according to claim 1, wherein said fitting fixing portion includes a fitting space having a size corresponding to a width of the board.

10. The board connecting connector according to claim 1, wherein said fitting fixing portion includes a fitting space having a tapered shape.

11. The board connecting connector according to claim 1, wherein said board retaining portion is configured to fit into the terminal retaining portion in the fitting direction so that the board is sandwiched and the terminal portion formed on the board contacts with the contact portion of the terminal at the first location of the board retaining portion when the board retaining portion is fitted into the terminal retaining portion.

12. The board connecting connector according to claim 1, wherein said board retaining portion includes an opening portion for inserting the board, and said fitting fixing portion is situated closer to the opening portion than the board supporting portion so that the board passes through the fitting fixing portion before the board supporting portion when the board is inserted into the board retaining portion.

13. The board connecting connector according to claim 1, wherein said fitting fixing portion has a length smaller than that of the board supporting portion in the fitting direction.

* * * * *